(12) United States Patent
Lee et al.

(10) Patent No.: US 7,586,175 B2
(45) Date of Patent: Sep. 8, 2009

(54) SEMICONDUCTOR WAFER HAVING EMBEDDED ELECTROPLATING CURRENT PATHS TO PROVIDE UNIFORM PLATING OVER WAFER SURFACE

(75) Inventors: Kyoung Woo Lee, Fishkill, NY (US); Ja Hum Ku, Seongnam-si (KR); Ki Chul Park, Suwon-si (KR); Seung Man Choi, Fishkill, NY (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 31 days.

(21) Appl. No.: 11/551,864

(22) Filed: Oct. 23, 2006

(65) Prior Publication Data

US 2008/0093746 A1   Apr. 24, 2008

(51) Int. Cl.
*H01L 23/544* (2006.01)
*H01L 21/4763* (2006.01)

(52) U.S. Cl. .............................. 257/620; 257/E21.175; 257/E23.145; 438/622

(58) Field of Classification Search ................. 257/618, 257/620, 734, 750, 751, 758, 759, 760, 762, 257/773, 774, 775, 776, E23.142, E23.145, 257/E21.174, E21.175; 438/584, 597, 618, 438/622, 623, 624, 625, 626, 627, 642, 643, 438/687
See application file for complete search history.

(56) References Cited

U.S. PATENT DOCUMENTS

| | | | | |
|---|---|---|---|---|
| 5,834,829 A | * | 11/1998 | Dinkel et al. | ................. 257/620 |
| 6,197,688 B1 | | 3/2001 | Simpson | |
| 6,709,918 B1 | | 3/2004 | Ng et al. | |
| 6,794,234 B2 | | 9/2004 | Polishchuk et al. | |
| 2005/0285229 A1 | * | 12/2005 | Higashi et al. | ............... 257/620 |

FOREIGN PATENT DOCUMENTS

JP      05-109659     4/1993
KR     1020010063160  7/2001

OTHER PUBLICATIONS

Korean Notice of Allowance dated Dec. 14, 2007.

* cited by examiner

*Primary Examiner*—Evan Pert
*Assistant Examiner*—Kevin Quinto
(74) *Attorney, Agent, or Firm*—F. Chau & Associates, LLC

(57) ABSTRACT

A semiconductor wafer having multi-layer metallization structures that are fabricated to include embedded interconnection structures which serve as low-resistance electroplating current paths to conduct bulk electroplating current fed to portions of a metallic seed layer at peripheral surface regions of the wafer to portions of the metallic seed layer at inner/central surface regions of the semiconductor wafer to achieve uniformity in metal plating in chip regions across the wafer.

14 Claims, 6 Drawing Sheets

SEMICONDUCTOR WAFER HAVING EMBEDDED ELECTROPLATING CURRENT PATHS TO PROVIDE UNIFORM PLATING OVER WAFER SURFACE

TECHNICAL FIELD OF THE INVENTION

The present invention relates generally to methods for fabricating metal wiring layers, such a dual damascene copper interconnects, on a semiconductor wafer and, in particular, semiconductor wafers having embedded electroplating current paths that provide low resistance current paths to conduct bulk electroplating current from peripheral to inner/central surface regions of a semiconductor wafers to thereby achieve uniformity in metal plating over the surface of the wafer.

BACKGROUND

Due to continuing technological innovations in the field of semiconductor fabrication, IC (integrated circuit) manufactures are developing ICs with larger scale of integration, higher device density, lower power consumption and higher operating speeds. Typically, highly integrated circuits are designed using multi-level interconnection structures that are formed from different metal layers as part of a BEOL (back end of line) metallization process. In general, BEOL interconnection structures include intra-level interconnects (metal lines/wiring) and inter-level interconnects (plugs/contacts) embedded in interlayer dielectric (ILD) material.

In conventional BEOL metallization processes, metallic material such as aluminum (Al) was commonly sued to form chip interconnect structures. For example, one conventional BEOL process involves forming an AL metallization layer using a subtractive Al etch process. In general, this process includes depositing a layer of Al on a planarized ILD layer and then etching the AL layer using well-known techniques (e.g., reactive ion etching) to form a wiring/pad pattern for the given metallization layer. The Al etch is then followed by dielectric deposition and planarization to form the ILD layer for the given metallization layer.

As semiconductor devices are scaled down and constructed with increasing smaller design rules, it is undesirable to use aluminum to form metal interconnects because aluminum has a relatively high resistivity which limits chip performance (e.g., operating speed at submicron design rules and beyond. Accordingly, state of the art BEOL techniques for constructing multi-layered metal interconnection lines commonly use metallic material, such as copper (Cu), having low resistivity and high reliability to yield improved performance. Unlike aluminium, however, copper is difficult to pattern using a conventional photolithography/etching techniques, especially when the copper wires are formed according to relatively small design rules.

Accordingly, single and dual damascene methods have been developed to enable formation of highly integrated copper metal interconnect structures. In general, a damascene process includes deposition of a dielectric layer (e.g., ILD layer) and patterning the dielectric layer using standard photolithographic and RIE processes, for example, to define vias holes or trenches (for single damascene) or both via holes and trenches (for dual damascene) in the dielectric layer. After the vias/trenches are formed, a barrier layer is deposited over the patterned dielectric layer to line the exposed sidewalls of the via/trenches and copper deposition process is performed to fill the via/trenches with copper and form the interlevel contracts plugs and/or wiring. The excess copper material is removed from the surface of the wafer by planarizing the wafer surface down to the surface of the ILD layer.

FIG. 1 is a cross-sectional schematic view of a conventional BEOL metallization process for constructing multi-level metal layers on semiconductor wafer (100). In particular, FIG. 1 schematically illustrates a conventional dual damascene method for constructing metal wiring layers on the wafer (100). FIG. 2 is a top plan view of the semiconductor wafer (100) having a conventional layout of chip regions (10) formed on a surface of the wafer. For purposes of illustration, it may be assumed that FIG. 1 schematically illustrates a metallization structure having a repeating pattern in each chip region (10) of the wafer FIG. 1 illustrates an intermediate stage of Mx level fabrication, where a pattern of via holes/trenches (102) are formed in an ILD (inter level dielectric) layer (101) (e.g., silicon oxide) on the upper surface of the wafer (100). The via hole/trench regions (102) include via holes (102b) that are formed in the ILD layer (101) and aligned with lower metal lines (not shown) in the previous metallization level Mx−1. The corresponding trenches (102a) are formed in the ILD layer (101) aligned with the via holes (102b). A conformal liner layer (103) is formed over the entire surface of the wafer (100) to line the exposed surfaces of the ILD layer (101) and to line the bottom and sidewalls of the trenches/vias (102). The liner layer (103) typically comprises a stack of layers including a barrier layer and metallic seed layer sequentially formed on the dielectric layer (101). With copper metallization, the barrier layer may be a metal nitride such as TaN or other suitable conducting material that prevents diffusion of copper material into the dielectric layer and prevents oxidation at the copper material. Typically, a thin etch stop layer (104) is formed between the IDL layers to protect lower metal lines formed in the Mx−1 level.

The metal lines and contacts of the metallization layer Mx are formed by filling the via holes/trenches (102) with copper. The copper fill process is commonly performed using copper electroplating techniques which allow the holes (102b) and overlying line trenches (102a) to be filled at the same time, thus forming dual damascene copper interconnect structures. In order for copper to be deposited on the surface of the wafer (100) by electroplating, the entire wafer surface (100) is covered with a continuous metallic seed layer which serves to conduct bulk electroplating current from the edge of the wafer surface to the inner/central regions of the wafer surface deposition of copper is desired. When a barrier layer such as TaN is used to line the dielectric layer (101), the barrier layer cannot be used to conduct plating current as the barrier material has a high sheet resistance which prevents uniform electrolytic plating on the barrier layer formed over the surface of the substrate. Therefore, the copper seed layer is formed on the barrier layer (via sputtering process or a CVD process) over the entire surface of the wafer to serve as a plating seed layer in an electrolytic plating process.

FIG. 3 illustrates a conventional electroplating apparatus (20) for performing a damascene electroplating process, where a continuous metallic seed layer formed on the wafer surface is used to conduct bulk electroplating current from edge regions to inner/central regions of the wafer surface. In general, the apparatus (20) includes a cathode (21) and anode (22) disposed in electroplating copper solution (23). An electroplating voltage V applied to the cathode (21) and anode (22) causes copper material in the electroplating solution (23) to be plated on the surface of the cathode (21). For damascene electroplating, the cathode (21) is a semiconductor wafer having a continuous seed layer formed on a surface thereof to be plated. For illustrative purposes, it is assumed that the cathode (21) is the semiconductor wafer (100) of FIG. 2 at an intermediate stage of Mx fabrication as depicted in FIG. 1, where the continuous copper seed layer (103) is formed over the entire wafer surface and lining the sidewalls of the vias/trenches (102b/102a). When the wafer (100) is disposed in the apparatus (20) of FIG. 3, the wafer (100) is held in place in the electroplating apparatus (20) by using a clamp that extends around the periphery of the wafer (100) and which forms an electrical contact to the seed layer (103) at the periphery surface regions of the wafer (100) for applying the plating voltage. In this regard the thin metallic seed layer (103) provides a current path to conduct bulk electroplating current from the peripheral surface region of the wafer (100) to the inner/central surface regions of the wafer (100).

Conventional copper electroplating techniques can fill vias and trenches with nanoscale line widths and high aspect ratios. However, such methods become more problematic with decreasing design rules for various reasons. For instance, as devices are scaled down, the line widths become increasing smaller which requires either formation of ultra thin copper seed layers over the diffusion barrier layers, or otherwise use a barrier metal layer that serves as a diffusion barrier and seed layer. However, as the seed layers and barrier layers are made increasingly thinner, the sheet resistance of such layers increase resulting in non-uniformity of copper plating due to a relatively large potential drop of the plating voltage from the wafer edge to the wafer center as a result of the increase resistance along the current path of the seed Layer from the wafer edge to the wafer center More specifically, FIG. 3 schematically illustrates the electroplating solution having the same resistance R1 at all points between the cathode (21) (wafer) and anode (22) and a resistance R2 of the seed layer from wafer edge (WE) to wafer center (WC). When the resistance R2 is relatively large, there can be a relatively large potential drop (Lower voltage V) at the center of the wafer thereby making Cu plating non-uniform from the between the center and edge regions of the wafer. In particular, as depicted in FIG. 2, when electroplating current is applied to the seed layer in at the wafer edge WE, a very large voltage drop between the edge of the wafer and the center of the wafer can result in very non-uniform plating between the chip regions (10) located at the wafer edges and those chip regions located at the inner/center regions of the wafer. Non-uniformity in copper plating increases with larger wafers (300 mm).

SUMMARY OF THE INVENTION

Exemplary embodiments of the invention generally, include methods for fabricating metal wiring layers, such a dual damascene copper interconnects, on a semiconductor wafer. More specifically, exemplary embodiments of the invention include semiconductor wafers that are fabricated having embedded electroplating current paths that provide low resistance current paths to conduct bulk electroplating current from peripheral to inner/central surface regions of a semiconductor wafers to thereby achieve uniformity in metal plating over the surface of the wafer.

In one exemplary embodiment, a semiconductor wafer includes a plurality of chip regions formed on an active surface of the wafer and an embedded interconnection structure which electrically connects a plurality of adjacent chip regions of the wafer to provides a conductive path from a chip region formed at a peripheral region of the wafer to a chip region formed in an inner region of the wafer. The embedded interconnection structure serves as a continuous current path for electroplating current to flow from the peripheral region to the inner region of the wafer for an electroplating process.

In other exemplary embodiments of the invention, the embedded interconnection structure may include a metallic via trench structure and/or a metallic line trench structure. For example, the embedded interconnection structure includes a metal line pattern formed as part of a metallization level by a BEOL (back-end of line) metallization process, wherein at least a portion of the metal line pattern is formed as part of chip moisture barrier structures of a plurality of chip regions on the wafer and/or formed as part of chip crack stop structures of a plurality of chip regions on the wafer.

These and other exemplary embodiments, aspects, objects, features and advantages of the present invention will become apparent from the following detailed description of exemplary embodiments, which is to be read in connection with the accompanying drawings.

DETAILED DESCRIPTION OF EXEMPLARY EMBODIMENTS

Figure 1:
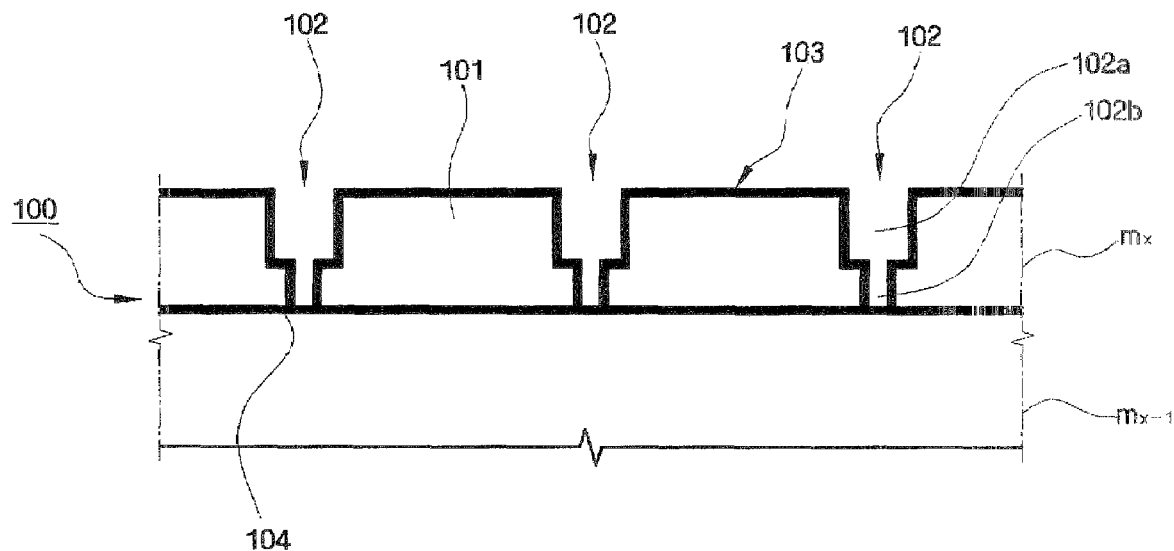
FIG. 1 is a cross-sectional schematic view of a conventional BEOL metallization process for constructing multilevel metal layers on semiconductor wafer.
Figure 2:
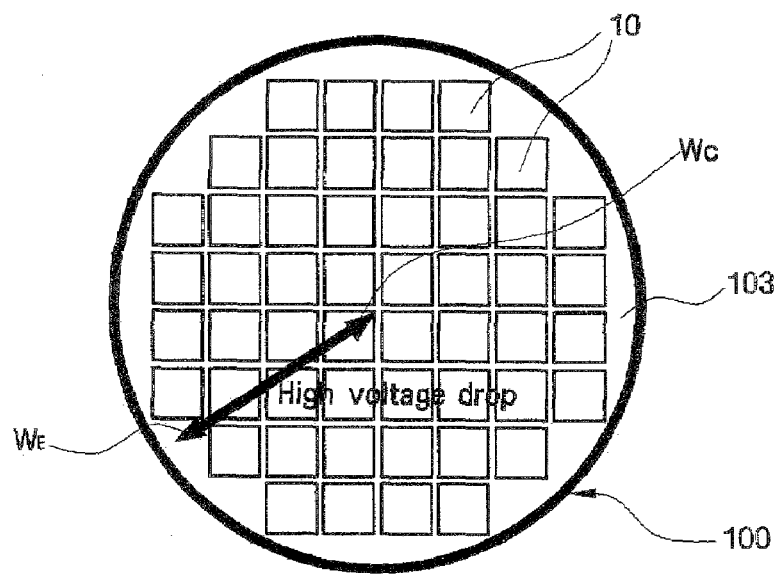
FIG. 2 is a top plan view of a semiconductor wafer having a conventional layout of chip regions formed on a surface of the wafer.
Figure 3:
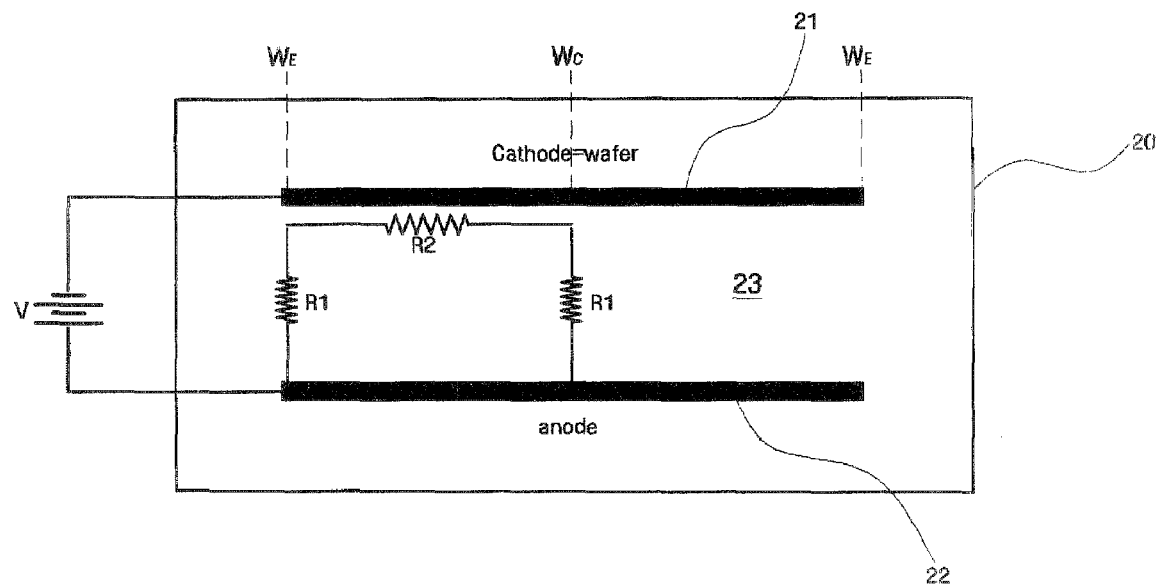
FIG. 3 illustrates a conventional electroplating apparatus for performing a damascene electroplating process using a continuous metallic seed layer formed on a wafer surface to conduct electroplating current from edge regions to inner/central regions of the wafer.

Exemplary embodiments of the invention will now be described more fully with reference to the accompanying drawings in which it is to be understood that the thickness and dimensions of the layers and regions are exaggerated for clarity. It is to be further understood that when a layer is described as being "on" or "over" another layer or substrate, such layer may be directly on the other layer or substrate, or intervening layers may also be present. Moreover, similar reference numerals used throughout the drawings denote elements having the same or similar functions.

Figure 4:
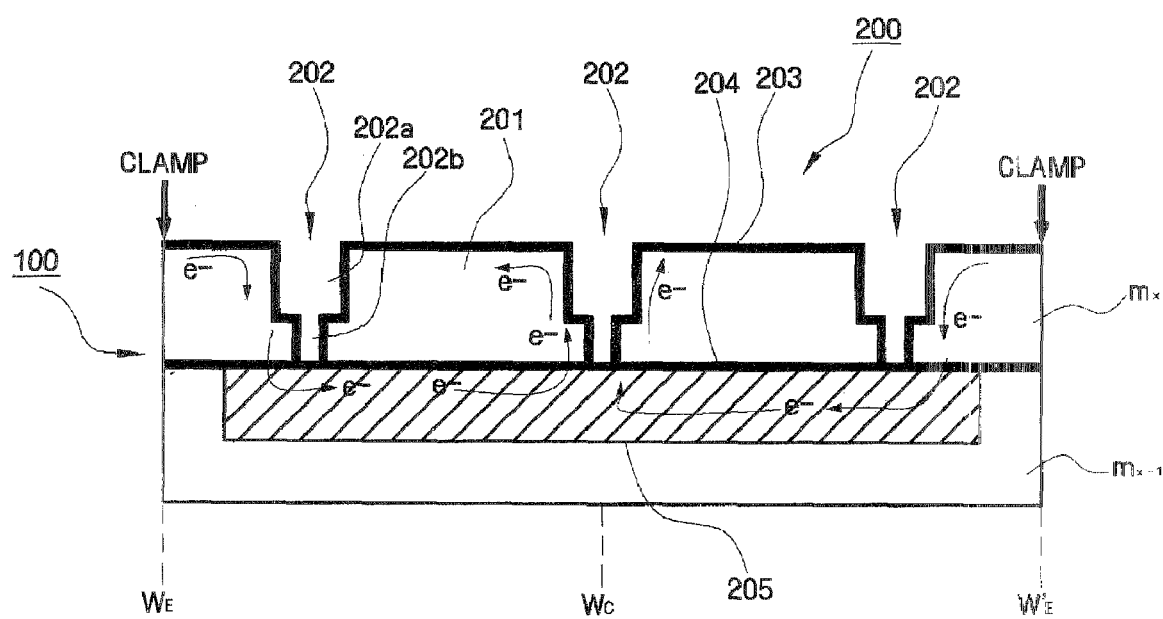
FIG. 4 is high-level schematic view of a semiconductor wafer having an embedded interconnection structure that provides an electrical path to conduct bulk electroplating current from edge regions to inner/central regions of the wafer, according to an exemplary embodiment of the invention.

FIG. 4 is high-level schematic view of a semiconductor wafer having an embedded interconnection structure that provides an electrical path to conduct bulk electroplating current from edge regions to inner/central regions of the wafer, according to an exemplary embodiment of the invention. FIG. 4 illustrates a conceptual method of forming an embedded interconnection structure (205) as part of a lower level of metallization, e.g., a previous level Mx−1, which provides a continuous low resistance current path (which extends between wafer edges) for conducting bulk plating current for a plating process when form an upper level of metallization Mx. FIG. 4 illustrates an intermediate stage of Mx level fabrication, where via holes/trenches (202) are formed in an ILD (inter level dielectric) layer (201). One or more conformal metallic layers (203) are formed over the entire surface of the wafer (200), i.e., over the surface of the ILD layer (201) and lining the exposed sidewall surfaces of the via holes (202b) and trenches (202a). An insulating etch stop layer (204) is formed between the ILD layers of the Mx and Mx−1 metallization levels.

In the exemplary embodiment of FIG. 4, the metallic layer(s) (203) may be formed of separate layers, e.g., a barrier layer (e.g., TaN) and seed layer (Cu), or a single metallic layer that serves as both a diffusion barrier for copper and seed layer for copper plating (e.g., Ruthenium) using known electroplating techniques. In contrast to conventional methods, however, the metallic (seed) layer (203) does not provide a primary current path to conduct plating current from the periphery of the wafer (200) to the central regions of the wafer (200). Instead, the embedded interconnection structure (205) provides a low resistance current path to conduct bulk plating current from a peripheral region WE of the wafer (200) to inner and central regions of wafer (200) where plating current is locally distributed to inner surface regions of the wafer through short conducting paths along portions of the metallic seed layer (203) disposed in the inner and center regions of the wafer (200), for example.

Indeed, as depicted in FIG. 4, when an electrode clamp is connected to the seed layer (203) on the edges WE of the wafer surface, the bulk current can flow through short paths of the continuous seed layer (203) to the embedded interconnection structure (205) at the wafer edges WE and then flow to the inner regions of the wafer (200) through the embedded interconnection (205). In this manner, plating current can flow from the embedded interconnection (205) to various regions of the thin seed layer (203) where the plating current can flow along shorter paths through the thin copper seed layer to provide a more uniform potential across the surface of the wafer (200).

Figure 5:
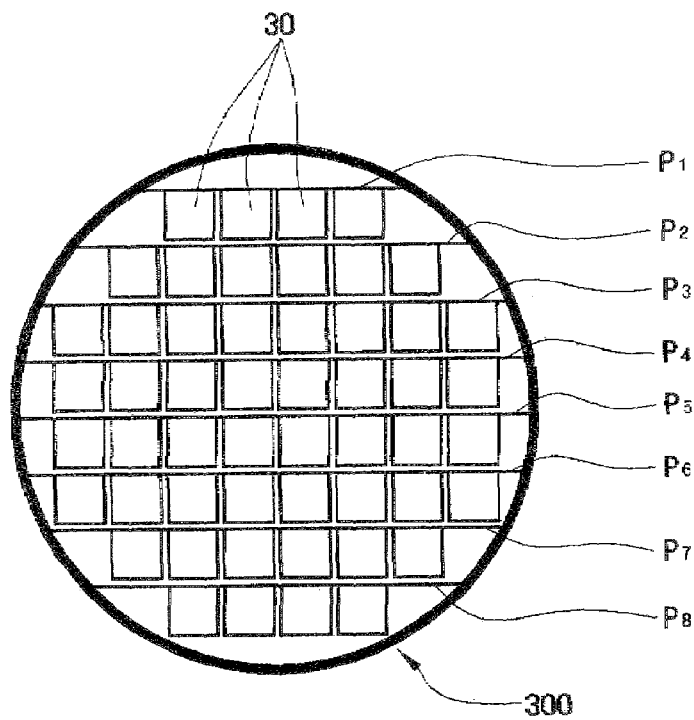
FIG. 5 is a schematic top plan view of a semiconductor wafer having a plurality of chip regions and a plurality of embedded interconnection structures each providing electroplating current paths to conduct bulk electroplating current to chip regions electrically coupled to respective embedded interconnection structures, according to an exemplary embodiment of the invention.

By way of example, FIG. 5 is a schematic top plan view of a semiconductor wafer having a plurality of chip regions and embedded interconnection structures providing electroplating current paths to conduct bulk electroplating current to chip regions electrically coupled to respective embedded interconnection structures, according to an exemplary embodiment of the invention. FIG. 5 illustrates a semiconductor wafer (300) having a plurality of chip regions (30) and a plurality of embedded current paths P1~P8 that longitudinally extend in a horizontal (row) direction between end regions of the wafer (300). Each embedded current path P1~P8 (or Pi) represents a continuous interconnection structure (formed at a given metallization level, Mi) which extends through, and is formed as part of metal structures in peripheral regions of a plurality of adjacent chip regions (30) (e.g., all chip regions (30) aligned in row direction between edge regions of the wafer (300) as in FIG. 5). As explained in further detail below, each embedded current path Pi can be a continuous metal line that is formed as part of crack stop regions and/or as part moisture barrier regions of adjacent chip regions (30) to provide low resistance current paths from the wafer edges to inner regions of the wafer. The plating current that is conducted in a given embedded current path Pi can readily flow to each chip region (30) connected to such path Pi, whereby the electroplating current can be fed to those regions of the metallic seed layer within, or in proximity to, each of the chip regions coupled to the given path Pi. This method allows for a more uniform voltage potential over the seed layer to achieve plating uniformity across the wafer surface.

Figure 6:
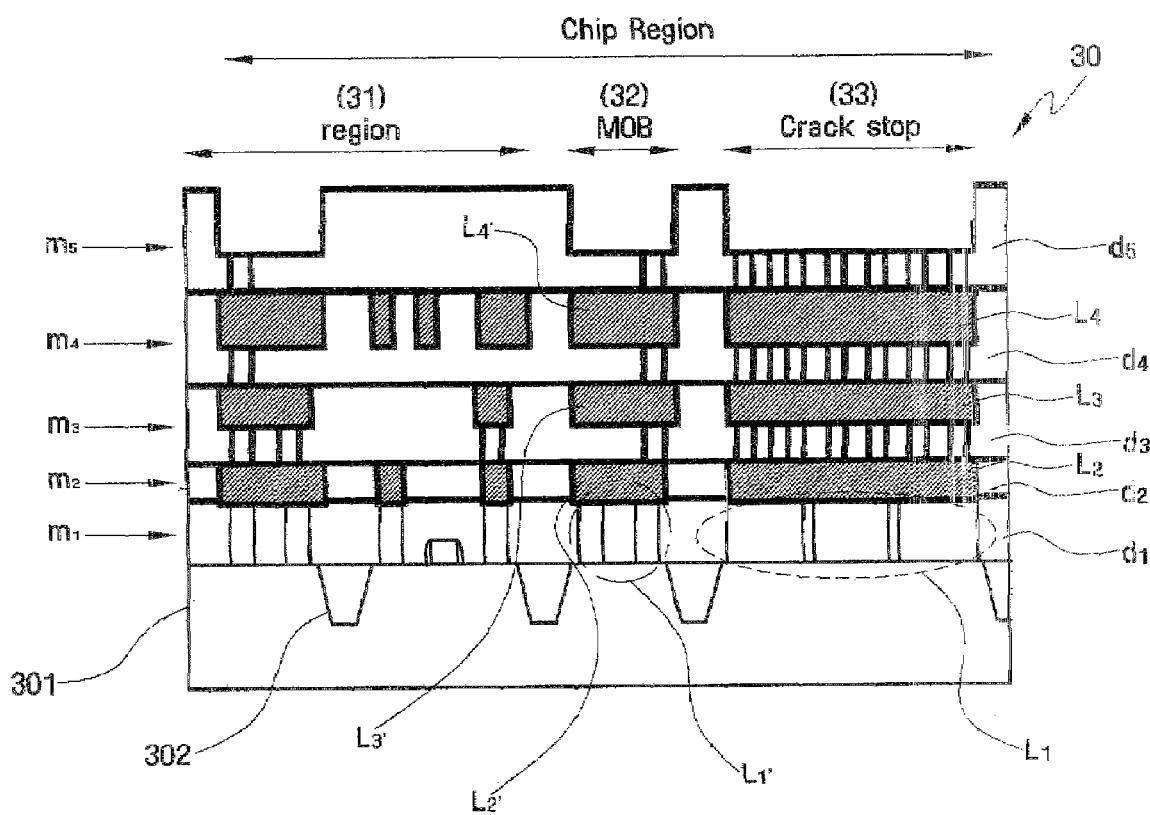
FIG. 6 is a schematic cross sectional view of a chip region formed on a semiconductor wafer having embedded interconnection structures for conducting electroplating current, according to an exemplary embodiment of the invention.

FIG. 6 is a schematic cross sectional view of a chip region formed on a semiconductor wafer having embedded interconnection structures for conducting electroplating current, according to an exemplary embodiment of the invention. FIG. 6 is schematic cross sectional view of an exemplary framework for each chip region (30) formed on the semiconductor wafer (300) of FIG. 5. FIG. 6 illustrates a portion of a wafer substrate (301) having an active circuit region (31), moisture barrier (MOB) region (32) and crack stop region (33). Active devices are formed in the active circuit region (31) and the active region (31) is surrounded by the MOB region (32) and the crack stop region (33). Moreover, FIG. 6 illustrates a plurality of BEOL metallization levels M1~M5 each comprising an ILD layer having interlevel metal wiring and/or plugs formed therein using known single and dual damascene techniques, for example.

In accordance with exemplary embodiments of the invention, embedded electroplating current interconnect structures can be formed in one or more metallization levels in the MOB region (32) and/or crack stop region (33). For instance, in one exemplary embodiment of the invention, one or more of crack stop plugs (L1) in the crack stop region (33) (which are formed as part of the first level of metallization M1) can be formed to continually extend through the crack stop regions of adjacent chip regions to form a metal line L1 that serves as an embedded current path for M2 copper metallization. By way of example, in the exemplary embodiment of FIG. 5, each embedded current path Pi can be a continuous metal line L1 which is formed by connecting contact plugs in the crack stop regions of adjacent chip regions (30) which extends in the horizontal direction between wafer edges.

Figure 7:
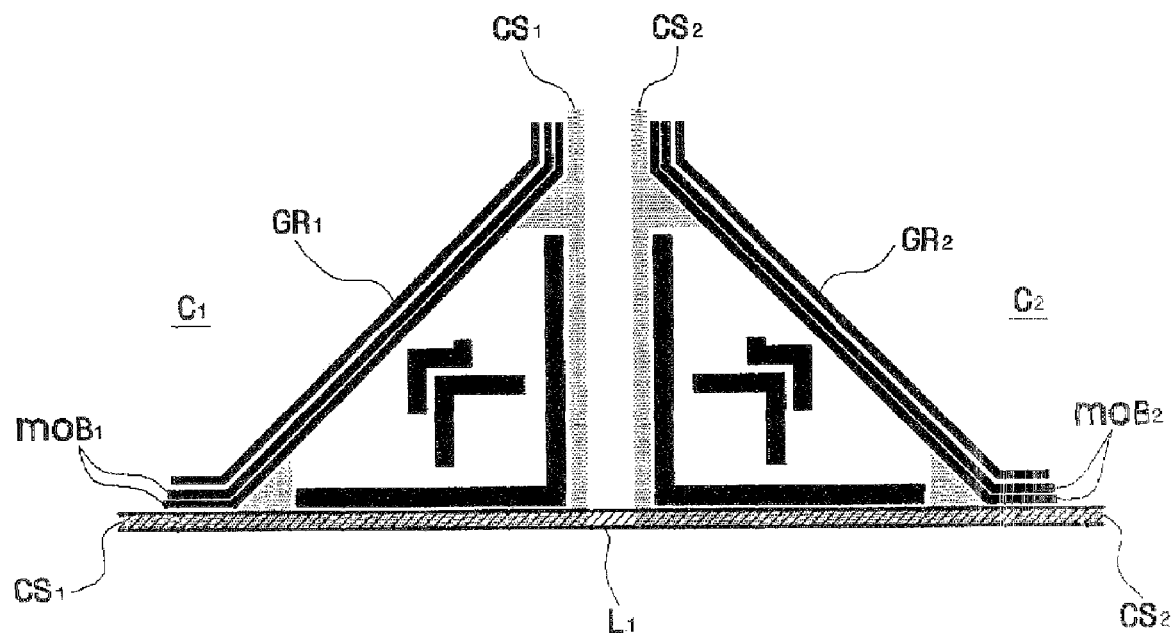
FIG. 7 schematically illustrates a top plan layout view of a semiconductor wafer having chip regions that are electrically coupled by embedded electroplating interconnection structures formed in the crack stop regions of the chip regions, according to an exemplary embodiment of the invention.

By way of example, FIG. 7 schematically illustrates a top plan layout view of a semiconductor wafer having chip regions that are electrically coupled by embedded electroplating interconnection structures formed in the crack stop regions of the chip regions, according to an exemplary embodiment of the invention. In particular, FIG. 7 illustrates adjacent chip regions C1 and C2 formed on a wafer, where each chip region C1 and C2 comprises respective chip guard rings GR1, GR2, crack stop regions, CS1, CS2, and moisture barrier regions MOB1, MOB2. FIG. 7 illustrates an exemplary embodiment of FIG. 6 where the embedded current path L1 is formed by forming some or all of the 3 contact plugs in the horizontal portions of crack stop regions CS1, CS2 as continuous metal lines that extend in a horizontal direction through the crack stop regions of adjacent chip regions.

Moreover, referring back to FIG. 6, the metal lines L2 and/or L2' that are formed in respective crack stop (33) and MOB (32) regions as part of the second level of metallization M2 can be formed to continually extend through the crack stop/MOB regions of adjacent chip regions to serve as embedded electroplating current paths for M3 copper metallization. Similarly, the metal lines L3 and/or L3' that are formed in respective crack stop (33) and MOB (32) regions as part of the third level metallization M3 can be formed to continually extend through the crack stop/MOB regions of adjacent chip regions to serve as embedded electroplating current paths for M4 copper metallization, and the metal lines L4 and/or L4' that are formed in respective crack stop (33) and MOB (32) regions as part of the fourth level metallization M4 can be formed to continually extend through the crack stop/MOB regions of adjacent chip regions to serve as embedded electroplating current paths for M5 copper metallization.

Figure 8:
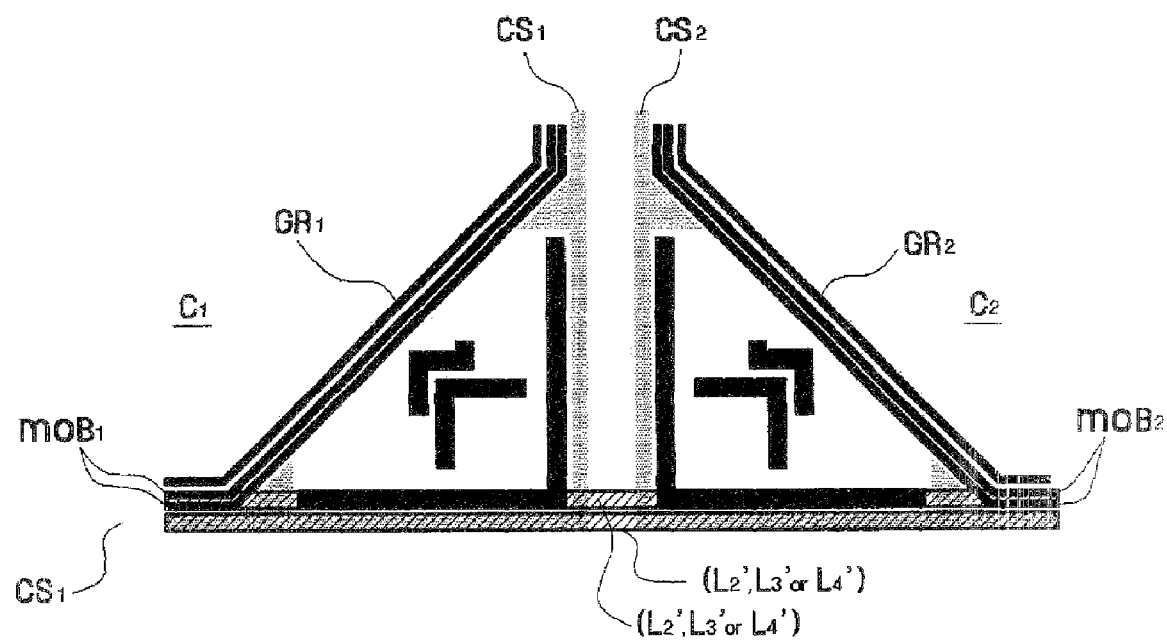
FIG. 8 schematically illustrates a top plan layout view of a semiconductor wafer having chip regions that are electrically coupled by embedded electroplating interconnection structures formed in the crack stop regions and/or moisture barrier regions of the chip regions, according to an exemplary embodiment of the invention.

FIG. 8 schematically illustrates a top plan layout view of a semiconductor wafer having chip region regions that are electrically coupled by embedded electroplating interconnection structures formed in the crack stop regions and/or moisture barrier regions of the chip regions, according to an exemplary embodiment of the invention. In particular, FIG. 8 illustrates adjacent chip regions C1 and C2 formed on a wafer similar to FIG. 7, but showing a continuous embedded current path formed by the L2, L3, or L4 metal line (FIG. 6), which extends in the horizontal direction in the crack stop regions of adjacent chip regions C1 and C2 and a continuous embedded current path from by the L2', L3', or L4' metal line (FIG. 6), which extends in the horizontal direction in the MOB regions of adjacent chip regions C1 and C2.

Figure 9:
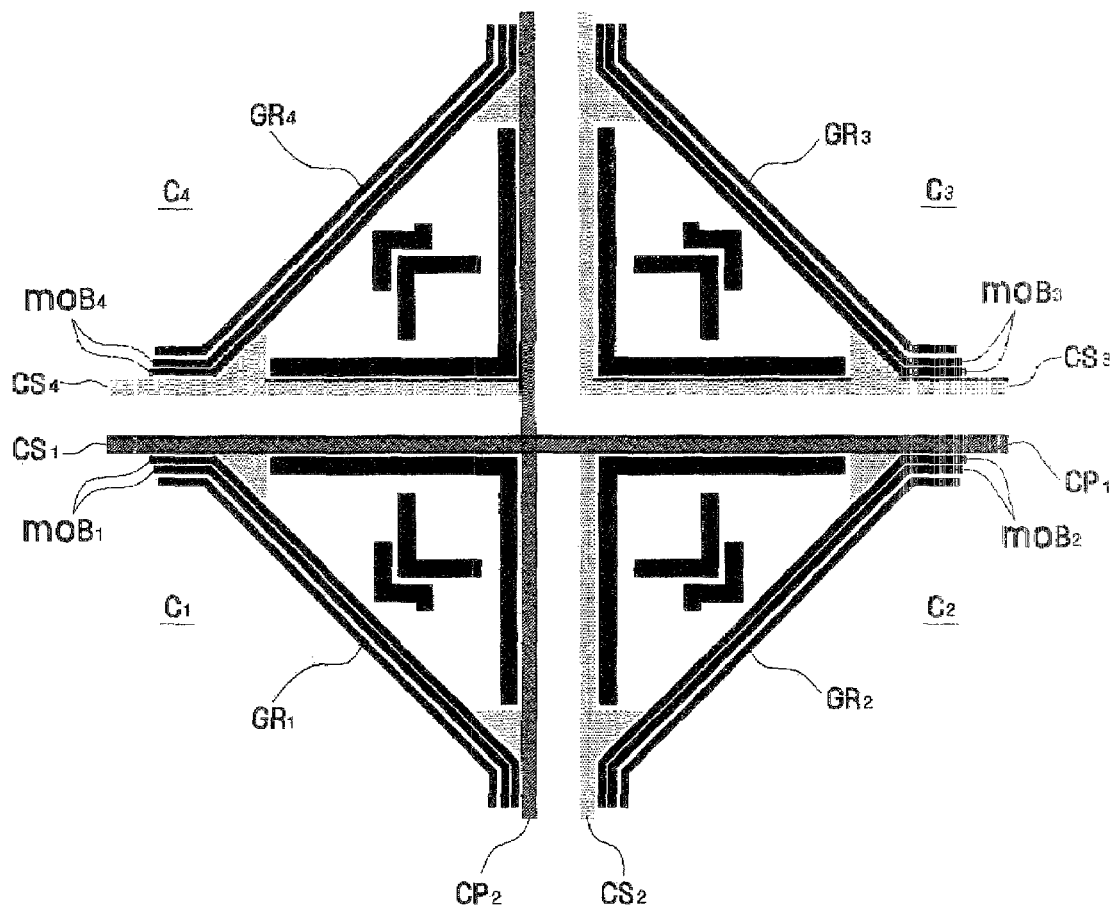
FIG. 9 schematically illustrates a top plan layout view of a semiconductor wafer having chip regions that are electrically coupled by embedded electroplating interconnection structures formed in the crack stop regions of the chip regions, according to another exemplary embodiment of the invention.

FIG. 9 schematically illustrates a top plan layout view of a semiconductor wafer having chip regions that are electrically coupled by embedded electroplating interconnection structures formed in the crack stop regions of the chip regions, according to another exemplary embodiment of the invention. FIG. 9 illustrates an exemplary embodiment in which embedded current paths are formed as continuous metal lines that extend in a horizontal direction through the crack stop regions of adjacent chip regions in a row direction, as well as continuous metal lines that extend in a vertical direction through the crack stop regions of adjacent chip regions in a column direction. In particular, FIG. 9 illustrates 4 adjacent chip regions C1, C2, C3 and C4 formed on a wafer. The adjacent chip regions C1 and C2 are connected by a continuous metal line (embedded current path) CP1 that extends in a horizontal direction through the crack stop regions CS1 and CS2 of the chip regions C1 and C2. Moreover, the adjacent chip regions C1 and C4 are connected by a continuous metal line (embedded current path.) CP2 that extends in a vertical direction through the crack stop regions CS1 and CS4 of the chip regions C1 and C4.

Figure 10:
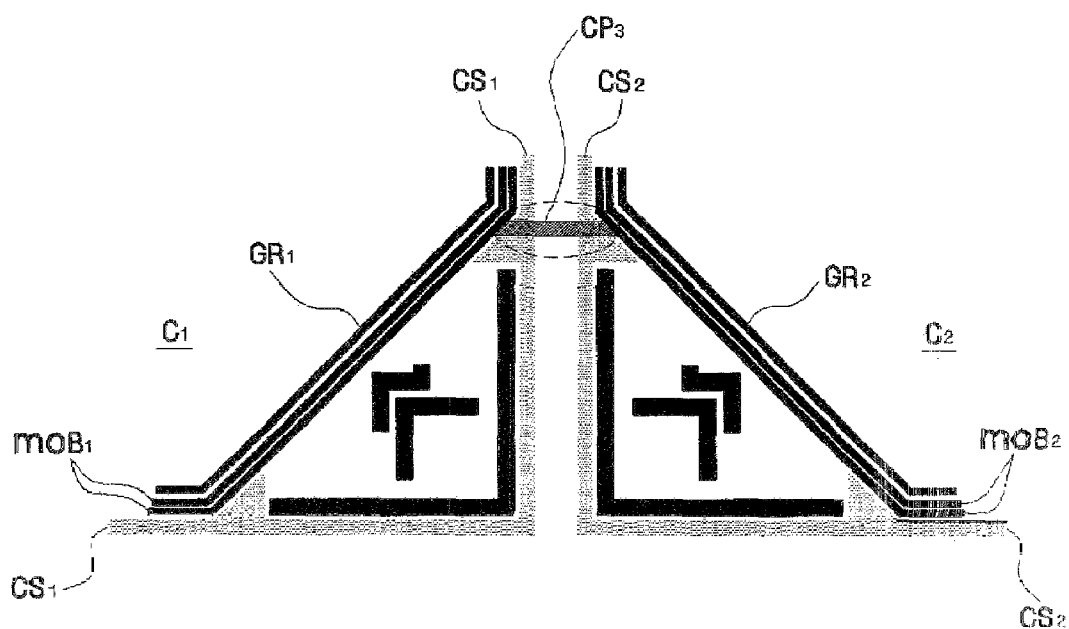
FIG. 10 schematically illustrates a top plan layout view of a semiconductor wafer having chip regions that are electrically coupled by embedded electroplating interconnection structures formed in the moisture barrier regions of the chip regions, according to another exemplary embodiment of the invention.

FIG. 10 schematically illustrates a top plan layout view of a semiconductor wafer having chip regions that are electrically coupled by embedded electroplating interconnection structures formed in the moisture barrier regions of the chip regions, according to another exemplary embodiment of the invention. In particular, FIG. 10 illustrates an exemplary embodiment in which embedded current path CP3 is formed to connect the wiring in the MOB regions MOB 1, MOB2 of adjacent chip regions C1 and C2. For example, in the embodiment of FIG. 6, the embedded current path CP3 can be formed to connect the L2', L3', or L4' metal lines (FIG. 6) of adjacent chip regions.

Figure 11:
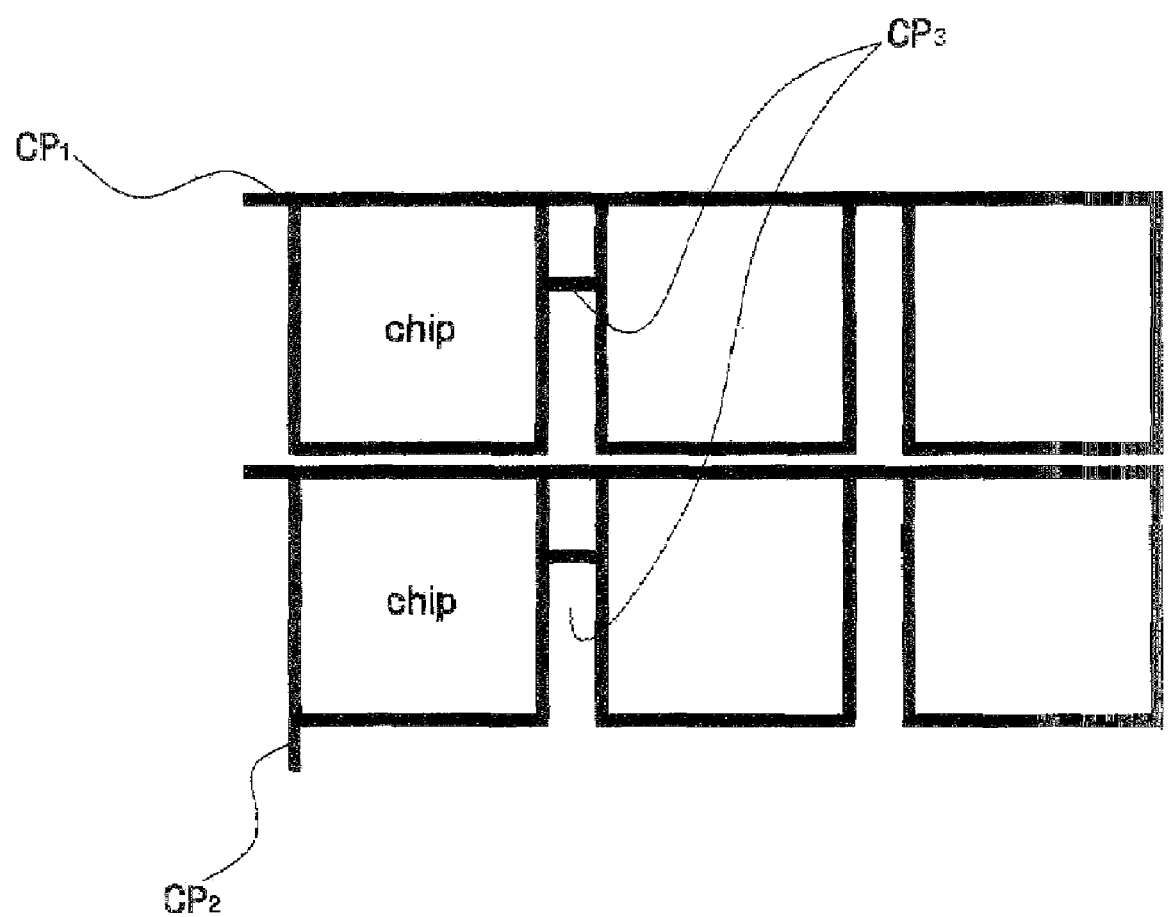
FIG. 11 is a schematic top plan view of a semiconductor wafer having a plurality of chip regions and embedded interconnection structures formed in the crack stop regions and moisture barrier regions of the chip regions, according to another exemplary embodiment of the invention.

FIG. 11 is a schematic top plan view of a semiconductor wafer having a plurality of chip regions and embedded interconnection structures formed in the crack stop regions and moisture barrier regions of the chip regions, according to another exemplary embodiment of the invention. In particular, FIG. 11 illustrates a plurality of wafer chip regions that are interconnected using embedded current paths CP1, CP2 formed by continuous interconnection formed at a given metallization level, Mi) in the MOB and/or crack stop regions of adjacent chip regions Ln a row direction and adjacent chip regions in a column direction, as well as embedded current paths CP3 connecting the MOB wiring between adjacent chip regions.

It is to be understood that the exemplary frameworks and methods for constructing embedded electroplating current paths discussed above are illustrative examples that are not intended to limit the scope of the invention. One of ordinary skill in the art can readily envision other frameworks and techniques for building and implementing embedded electroplating structures to provide low resistive paths for conducting bulk electroplating current from wafer edge to inner/central regions of the wafer to achieve electroplating uniformity over the wafer surface. Indeed, the amount and/or layout of embedded current paths needed to achieve electroplating uniformity of BEOL processing for a given wafer can widely vary depending on factors such as the electroplating process and plating solution used, the materials used to form the chips, the size of the semiconductor wafer, etc. In all exemplary embodiments, the embedded electroplating current paths in a given wafer will be formed so as to obtain a desired voltage potential across the wafer surface and achieve plating uniformity for a given electroplating process.

Moreover, semiconductor wafers having embedded electroplating current paths can be formed using known fabrication techniques, while requiring no additional processing steps. For instance, the exemplary structure of FIG. 6 can be fabricated using various processing steps as follows. Starting with the semiconductor wafer substrate (301), an isolation layer (302) (e.g., STI (shallow trench isolation) can be formed to define an active circuit region (31), a MOB region (32) and a crack stop region (33) for each of a plurality of chip regions (30) formed on the wafer substrate (301). A plurality of active devices (e.g., transistors are formed in the active region (31).

Thereafter, a first ILD layer (d1) (e.g., silicon dioxide) is formed over the surface of the wafer substrate (301), followed by an dielectric etch process and metal deposition process to form a plurality of metallic plugs in the ILD layer (d1) to provide contacts to active devices in the active region (31) and wiring/pads in the next level of metallization (M2) using known techniques and materials. The conductive plug structures L1' and L1 in the MOB region (32) and crack stop region (33) are trench via plugs that are formed to extend around the active region (31). In one exemplary embodiment of the invention as discussed above, the trench via plugs L1 and/or L1' can be formed to provide continuous metal traces that extend through and connect a plurality of adjacent chip regions extending in row or column direction between wafer edges. The contact via plugs in the active region (31) and trench via plugs in the MOB and crack stop regions (32), (33) can be formed using a refractory metal such as tungsten (W) using CVD. A barrier layer such as titanium (Ti) or titanium nitride (TiN) is preferably formed between the tungsten and the semiconductor material d1 to enhances adhesion and lowers the contact resistance between the tungsten layers and the impurity regions. A TiN layer may be deposited, for example, by sputtering prior to tungsten deposition by low pressure CVD, sputtering or electron beam evaporation.

Next, a thin etch stop layer and ILD layer (d2) is formed over the first level of metallization M1, followed by a dielectric etch and metal deposition processes to form wiring or traces forming the second level of metallization M2. In one exemplary embodiment, the metal wiring in M2 can be copper wiring that is formed using a single damascene process to form the trench openings in the ILD layer (d2) and copper electroplating to fill the trenches with copper and planarizing/polishing to remove excess copper. A liner material is deposited to line the trenches prior to metal deposition to provide a seed layer for metal plating. In one exemplary embodiment of the invention, as noted above, the liner layer may be formed from a layer Ta/TaN to provide a diffusion barrier and a thin conformal copper seed layer to provide a good electrolytic plating surface. In other embodiments, the liner layer may be a singly metallic layer of material such as Ru that serves as a diffusion barrier and seed layer for electroplating.

Next, a third dielectric layer (D3) is deposited, over the planarized dielectric layer (d2) of the second level of metallization M2, followed by dielectric etch process to form vias/trenches in the various regions (31), (32) and (33). A metal deposition process is then performed using dual damascene techniques to deposit a conformal liner and copper electroplating to fill the vias/trenches to form copper plugs and traces in the ILD layer d4. The above dual damascene process is repeated for each subsequent metal-plug level M4, M5, etc.

While the present invention has been particularly shown and described with reference to exemplary embodiments thereof, it will be understood by those skilled in the art that various changes in form and details may be made therein without departing from the spirit and scope of the invention as defined by the appended claims.

We claim:

1. A semiconductor wafer, comprising:
   a plurality of chip regions formed on an active surface of the wafer and separated by scribe areas, each chip region comprising an active circuit region and a moisture barrier region (MOB), and a multi-layer interconnect structure including a first metallization layer and a second metallization layer; and
   an embedded interconnection structure formed as part of the first metallization layer to electrically couple two or more chip regions,
   wherein the embedded interconnection structure provides an electrical path to conduct bulk electroplating current to each of the electrically coupled chip regions including the MOBs and to feed said electroplating current to those regions of a metallic seed layer within, or in proximity to, each of the electrically coupled chip regions, to perform an electroplating process to form the second metallization layer, wherein each chip region further comprises a crack stop region, and wherein the embedded interconnection structure comprises a continuous conductive structure that connects the crack stop regions of each of the electrically coupled chip regions.

2. The semiconductor wafer of claim 1, wherein each chip region further comprises a crack stop region, and wherein the embedded interconnection structure comprises a continuous conductive structure that connects the MOB regions of the electrically coupled chip regions.

3. The semiconductor wafer of claim 1, wherein the embedded interconnection structure comprises a continuous conductive structure starting from a first chip region located at first peripheral region of the wafer and terminating at a second chip region located at a second peripheral region of the wafer.

4. The semiconductor wafer of claim 1, wherein the first and second metallization layers are adjacent metallization layers.

5. The semiconductor wafer of claim 1, wherein the first and second metallization layers are separated by one or more metallization layers interposed between the first and second metallization layers.

6. The semiconductor wafer of claim 1, wherein the embedded interconnection structure comprises a metallic via trench structure.

7. The semiconductor wafer of claim 1, wherein the embedded interconnection structure comprises a metallic line trench structure.

8. A method for fabricating interconnect layers of a semiconductor wafer, comprising:
   defining a plurality of chip regions on an active surface of a semiconductor wafer, where each chip region comprises an active circuit region, a moisture barrier (MOB) region surrounding the active circuit region, and a crack stop region surrounding the active circuit region;
   forming a multi-layer interconnect structure including a first metallization layer and a second metallization layer in each of the chip regions, wherein forming the multi-layer interconnect structure comprises:
      forming an embedded interconnection structure as part of the first metallization layer to electrically couple two or more chip regions;
      forming the second metallization level by electroplating a metallic material on a metallic seed layer using the embedded interconnection structure to conduct bulk electroplating current to each of the electrically coupled chip regions and to feed said electroplating current to those regions of the metallic seed layer within, or in proximity to, each of the electrically coupled chip regions; and
      forming the embedded interconnection structure as a continuous conductive structure that connects the crack stop regions of each of the electrically coupled chip regions.

9. The method of claim 8, comprising forming the embedded interconnection structure as a continuous conductive structure that connects the MOB regions of the electrically coupled chip regions.

10. The method of claim 8, wherein the embedded interconnection structure is formed as a continuous conductive structure that extends from a first chip region located at first peripheral region of the wafer and terminates at a second chip region located at a second peripheral region of the wafer.

11. The method of claim 8, wherein the first and second metallization layers are adjacent metallization layers.

12. The method of claim 8, wherein the first and second metallization layers are separated by one or more metallization layers formed between the first and second metallization layers.

13. The method of claim 8, wherein the embedded interconnection structure comprises a metallic via trench structure.

14. The method of claim 8, wherein the embedded interconnection structure comprises a metallic line trench structure.

* * * * *